United States Patent
Kim et al.

(10) Patent No.: US 9,893,071 B2
(45) Date of Patent: Feb. 13, 2018

(54) SEMICONDUCTOR DEVICE AND METHOD FOR FORMING THE SAME

(71) Applicant: SK hynix Inc., Icheon (KR)

(72) Inventors: Jae Soo Kim, Seoul (KR); Jae Chun Cha, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/050,385

(22) Filed: Feb. 22, 2016

(65) Prior Publication Data

US 2016/0172364 A1 Jun. 16, 2016

Related U.S. Application Data

(62) Division of application No. 13/189,371, filed on Jul. 22, 2011, now abandoned.

(30) Foreign Application Priority Data

Oct. 25, 2010 (KR) ........................ 10-2010-0104281

(51) Int. Cl.
*H01L 27/108* (2006.01)
*H01L 21/265* (2006.01)
*H01L 21/768* (2006.01)
*H01L 29/423* (2006.01)

(52) U.S. Cl.
CPC .. *H01L 27/10855* (2013.01); *H01L 21/26506* (2013.01); *H01L 21/26513* (2013.01); *H01L 21/76883* (2013.01); *H01L 27/10885* (2013.01); *H01L 27/10888* (2013.01); *H01L 29/4236* (2013.01); *H01L 2924/00013* (2013.01)

(58) Field of Classification Search
CPC ......... H01L 27/10855; H01L 21/26506; H01L 21/26513; H01L 21/76883
USPC ................. 438/238–240, 386, 389–392, 399
See application file for complete search history.

(56) References Cited

U.S. PATENT DOCUMENTS

| | | | | | |
|---|---|---|---|---|---|
| 5,387,550 | A | * | 2/1995 | Cheffings | .......... H01L 21/76877 257/E21.584 |
| 5,580,821 | A | * | 12/1996 | Mathews | .......... H01L 21/76804 257/E21.578 |
| 5,677,219 | A | * | 10/1997 | Mazure | ............. H01L 27/10861 257/E21.651 |
| 5,789,310 | A | * | 8/1998 | Pramanick | ........ H01L 21/26506 257/E21.335 |
| 5,929,526 | A | * | 7/1999 | Srinivasan | ........ H01L 21/76843 257/758 |

(Continued)

FOREIGN PATENT DOCUMENTS

KR 10-2009-0067576 A 6/2009

*Primary Examiner* — Ori Nadav

(57) ABSTRACT

A semiconductor device and a method for forming the same are disclosed. The semiconductor device includes a semiconductor substrate including an active region defined by a device isolation film, a bit line contact plug that is coupled to the active region and that includes a first ion implantation region buried in a first inner void, and a storage node contact plug that is coupled to the active region and includes a second ion implantation region buried in a second inner void. Although the semiconductor device is highly integrated, a contact plug is buried to prevent formation of a void, so that increase in contact plug resistance is prevented, resulting in improved semiconductor device characteristics.

9 Claims, 8 Drawing Sheets

(56) References Cited

U.S. PATENT DOCUMENTS

| | | | | |
|---|---|---|---|---|
| 5,970,374 | A * | 10/1999 | Teo | H01L 21/76843 257/E21.584 |
| 6,221,754 | B1 * | 4/2001 | Chiou | H01L 21/76877 257/E21.585 |
| 6,232,233 | B1 * | 5/2001 | Chaudhary | H01J 37/32082 257/E21.008 |
| 6,265,302 | B1 * | 7/2001 | Lim | H01L 21/76897 257/E21.507 |
| 7,465,650 | B2 * | 12/2008 | Derderian | H01L 21/76877 257/E21.046 |
| 2009/0087981 | A1 * | 4/2009 | Suzuki | H01L 21/28518 438/643 |
| 2009/0152608 | A1 * | 6/2009 | Choi | H01L 27/10855 257/296 |
| 2009/0238365 | A1 * | 9/2009 | Bardera Bosch | G06F 21/645 380/259 |
| 2010/0237397 | A1 * | 9/2010 | Uchiyama | H01L 27/10876 257/306 |
| 2012/0007164 | A1 * | 1/2012 | Sugihara | H01L 27/11521 257/316 |

* cited by examiner

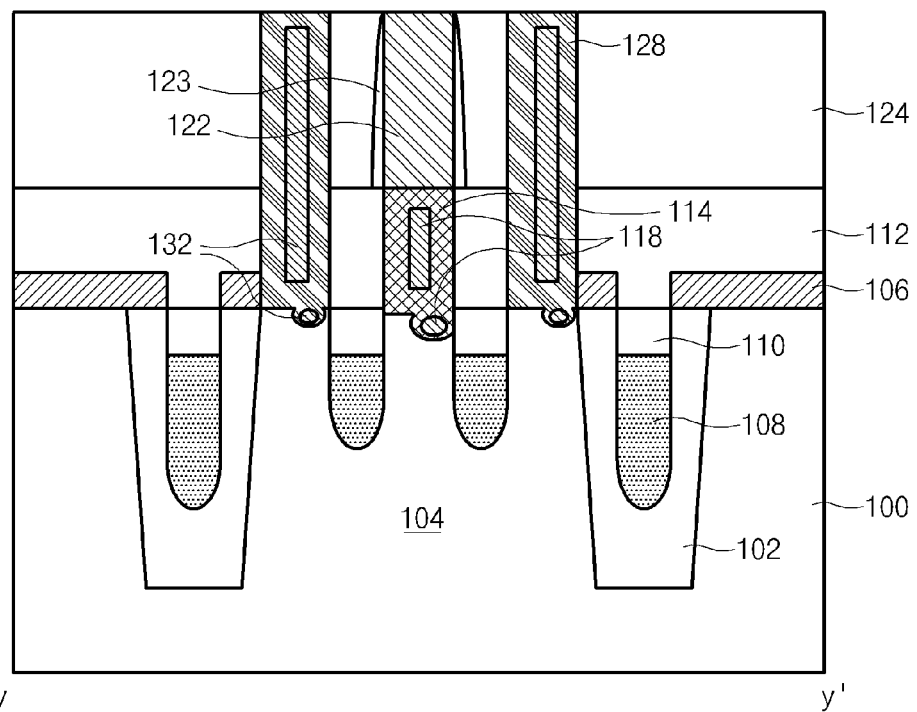
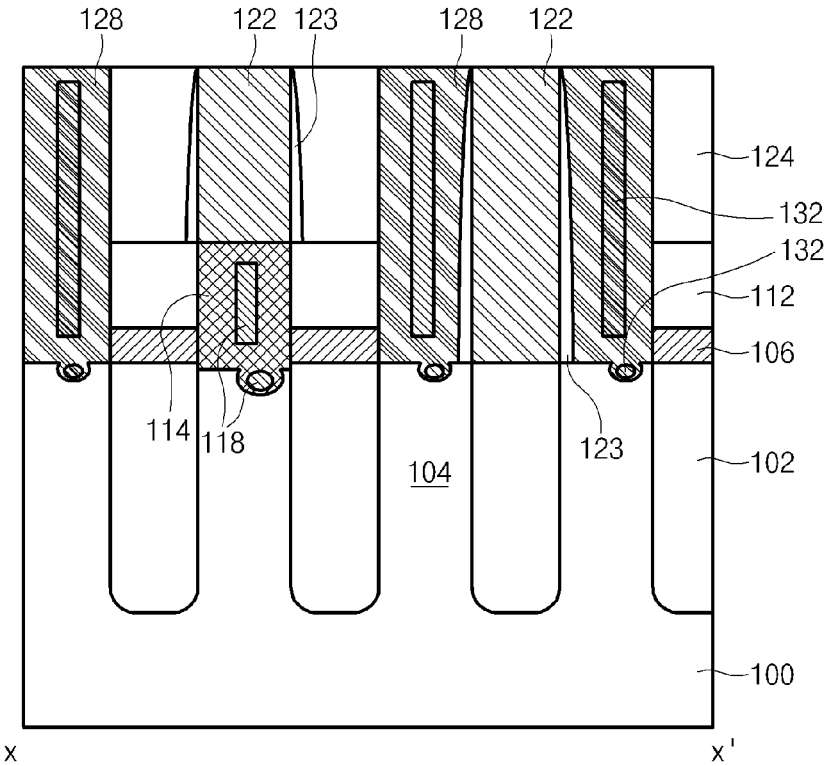

SEMICONDUCTOR DEVICE AND METHOD FOR FORMING THE SAME

CROSS-REFERENCE TO RELATED APPLICATION

The present application is a divisional of U.S. patent application Ser. No. 13/189,371 filed Jul. 22, 2011, which claims priority of Korean Patent Application No. 10-2010-0104281 filed on Oct. 25, 2010, the disclosures of which are hereby incorporated in their entireties by reference.

BACKGROUND OF THE INVENTION

Embodiments of the present invention relate to a semiconductor device and a method for forming the same, and more particularly to a semiconductor device including a contact plug and a method for forming the same.

Recently, most electronic appliances comprise a semiconductor device. Semiconductor devices include electronic elements such as transistors, resistors and capacitors. These electronic elements are designed to perform electronic functions, and are integrated on a semiconductor substrate. For example, an electronic appliance, such as a computer or a digital camera, includes a memory chip for storing information and a processing chip for controlling information. The memory chip and the processing chip include electronic elements integrated on a semiconductor substrate.

Semiconductor devices must increase in integration degree in order to satisfy consumer demands for superior performance and low prices. Such an increase in the integration degree of a semiconductor device entails a reduction in a design rule, causing patterns of a semiconductor device to be increasingly reduced. Although an entire chip area is increased, a cell area, where patterns of a semiconductor device are actually formed, is decreased. Accordingly, since a greater number of patterns should be formed in a limited cell area in order to achieve a desired memory capacity, there is a need for formation of microscopic (fine) patterns having a reduced minimum pattern size.

Meanwhile, as the minimum pattern size of such microscopic patterns is gradually reduced, a hole pattern for connecting upper and lower conductive lines to each other is significantly affected by a design rule, as compared to line and space patterns. In more detail, an increase in the integration degree of a semiconductor device causes a reduction in a contact hole size and the distance between the contact hole and its neighboring conductive line. Consequently, this causes an increase in an aspect ratio of the contact hole, that is, a ratio of a depth with respect to a diameter of the contact hole. In a highly integrated semiconductor device having multilayered conductive lines, a contact forming process may require precise and strict mask alignment, which entails a reduction in process tolerance, making a patterning process difficult.

Meanwhile, a bit line contact plug or a storage node contact plug is generally formed of polysilicon. If polysilicon is employed as material filling in the contact plugs in a highly-integrated semiconductor device, a void is likely to form in the contact plug. When a heat process is performed in a subsequent process, the size of the void increases.

The void increases the resistance of a contact plug and deteriorates semiconductor device characteristics. As a result, a method for preventing the void from forming so as to reduce resistance of a contact plug is needed.

BRIEF SUMMARY OF THE INVENTION

Various embodiments of the present invention are directed to providing a semiconductor device and a method for forming the same that substantially obviate one or more problems due to limitations and disadvantages of the related art.

An embodiment of the present invention relates to a semiconductor device and a method for forming the same, which can solve the problems of the related art in which a void forms in a conductive layer of a contact due to the high-integration degree of the semiconductor device during the formation of a contact plug.

In accordance with an aspect of the present invention, a semiconductor device includes a semiconductor substrate including an active region defined by a device isolation film; and a contact plug that is coupled to the active region; and includes an ion implantation region provided within an inner void, wherein the inner void is provided in the contact plug.

The contact plug may include a bit line contact plug, a storage node contact plug or a combination thereof, wherein the ion implantation region includes dopants provided within silicon material.

The void may include a slit-shaped void, a circular-shaped void or a combination thereof.

The ion implantation region may be formed by implanting silicon (Si+) ions and phosphorous (P+) ions.

The semiconductor device may further include a buried gate electrode layer formed in the device isolation film and the active region.

The semiconductor device may further include a bit line formed over a bit line contact plug and coupled to the bit line contact plug.

The semiconductor device may further include a bit line spacer formed at sidewalls of the bit line contact plug and the bit line.

In accordance with another aspect of the present invention, a method for forming a semiconductor device includes providing a semiconductor substrate including an active region defined by a device isolation film; and forming a contact plug that is coupled to the active region, the contact plug including a void therewithin; and providing ions into the void to form an ion implantation region, the ions including silicon material and dopants.

The ions are provided within the void using an ion implantation step, the ion implantation region may include implanting silicon (Si+) ions and phosphorous (P+) ions through the contact plug and into the void.

The forming of the contact plug may include forming a bit line contact plug; and forming a storage node contact plug.

The method may further include forming a gate electrode layer formed in the device isolation film and the active region.

The forming of the bit line contact plug may include forming a first interlayer insulation film over the semiconductor substrate; forming a bit line contact hole by etching the first interlayer insulation film to expose the active region; and burying a first conductive layer in the bit line contact hole.

The burying of the conductive layer in the bit line contact hole may include forming a first void in the first conductive layer.

The method may further include forming a bit line over the bit line contact plug in such a manner that the bit line is coupled to the bit line contact plug.

The forming of the storage node contact plug may include forming a second interlayer insulation film over a first interlayer insulation film; forming a storage node contact hole by etching a second interlayer insulation film and the first interlayer insulation film to expose the active region; and burying a second conductive layer in the storage node contact hole.

The burying of the second conductive layer in the storage node contact hole may include forming a second void in the conductive layer.

It is to be understood that both the foregoing general description and the following detailed description of the present invention are exemplary and explanatory and are intended to provide further explanation of the invention as claimed.

BRIEF DESCRIPTION OF THE DRAWINGS

FIGS. 2A and 2B illustrate a semiconductor device according to an embodiment of the present invention. FIG. 2A is a cross-sectional view taken along the line y-y' of FIG. 1, and FIG. 2B is a cross-sectional view taken along the line x-x' of FIG. 1.

FIGS. 3Aa to 3Fa, are cross-sectional views taken along the line y-y' of FIG. 1, and FIGS. 3Ab to 3Fb are cross-sectional views taken along the line x-x' of FIG. 1.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1:
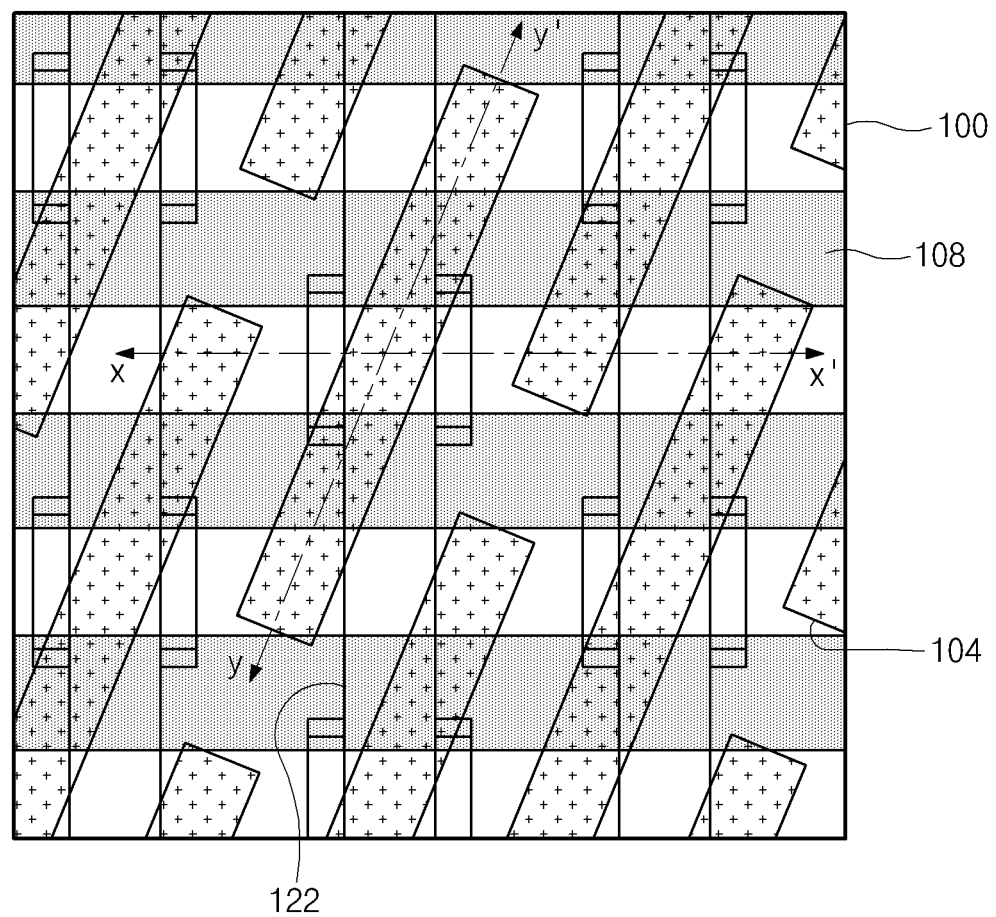
FIG. 1 is a plan view illustrating a semiconductor device according to an embodiment of the present invention.

FIG. 1 is a plan view illustrating a semiconductor device according to an embodiment of the present invention.

Referring to FIG. 1, the semiconductor device according to the present invention includes a semiconductor substrate 100 including an active region 104 defined by a device isolation film 102 (not shown), a gate electrode layer 108 in the device isolation film 102 and the active region 104, the gate electrode layer 108 being arranged along a horizontal direction; and a bit line 122 coupled to the active region 104, and arranged along a vertical direction.

FIGS. 2A and 2B illustrate a semiconductor device according to an embodiment of the present invention. FIG. 2A is a cross-sectional view taken along the line y-y' of FIG. 1, and FIG. 2B is a cross-sectional view taken along the line x-x' of FIG. 1.

Referring to FIGS. 2A and 2B, the semiconductor device according to the present invention includes a semiconductor substrate 100 including an active region 104 defined by a device isolation film 102; a bit line contact plug 114 that is coupled to the active region 104 and includes an ion implantation region 118; and a storage node contact plug 128 that is coupled to the active region 104 and includes an ion implantation region 132.

Preferably, the ion implantation region 132 may be formed by implanting silicon ions (Si+) and phosphorus ions (P+). Preferably, the semiconductor device may further include a buried gate electrode layer 108 formed in the device isolation film 102 and the active region 104; and a capping insulation film 110 formed over the buried gate electrode layer 108 and having a surface substantially level to the surface of the device isolation film 102.

In addition, the semiconductor device may further include a bit line 122 coupled to a bit line contact plug 114, and a bit line spacer 123 formed at sidewalls of the bit line contact plug 114 and a bit line 122. In addition, the semiconductor device may further include interlayer insulation films 124 and 112 by which the bit line 122 is insulated from a storage node contact plug 128.

An ion implantation region is formed in the bit line contact plug 114 to prevent a void from forming, thereby preventing contact plug resistance from increasing.

A method for forming the above-mentioned semiconductor device according to the present invention is as follows.

Figure 3A:
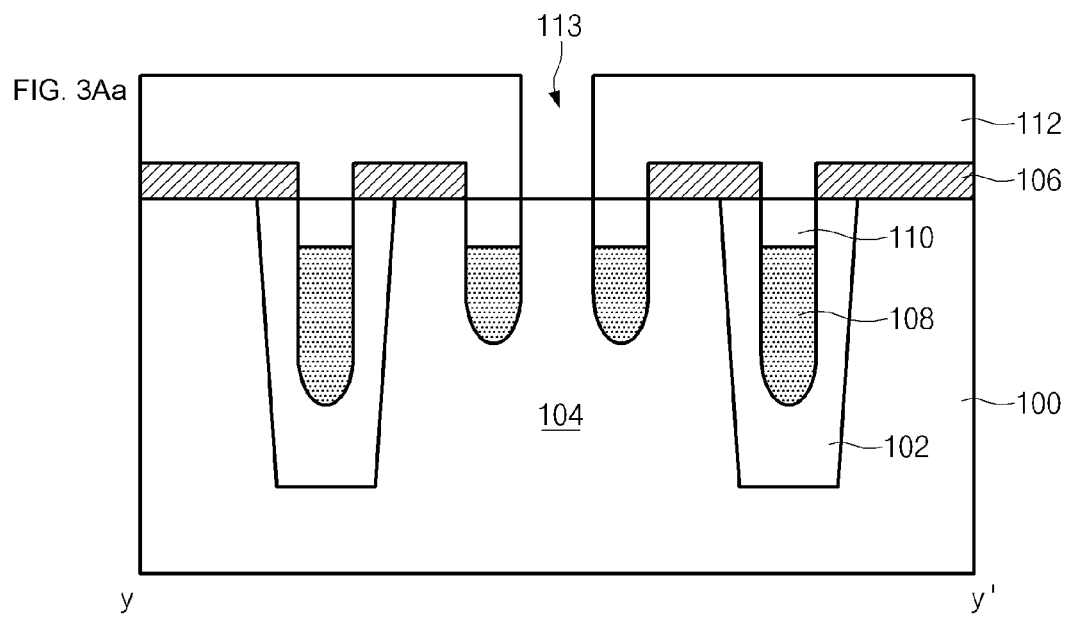
FIGS. 3Aa to 3Fb illustrate a method for forming a semiconductor device according to an embodiment of the present invention.
Figure 3A:
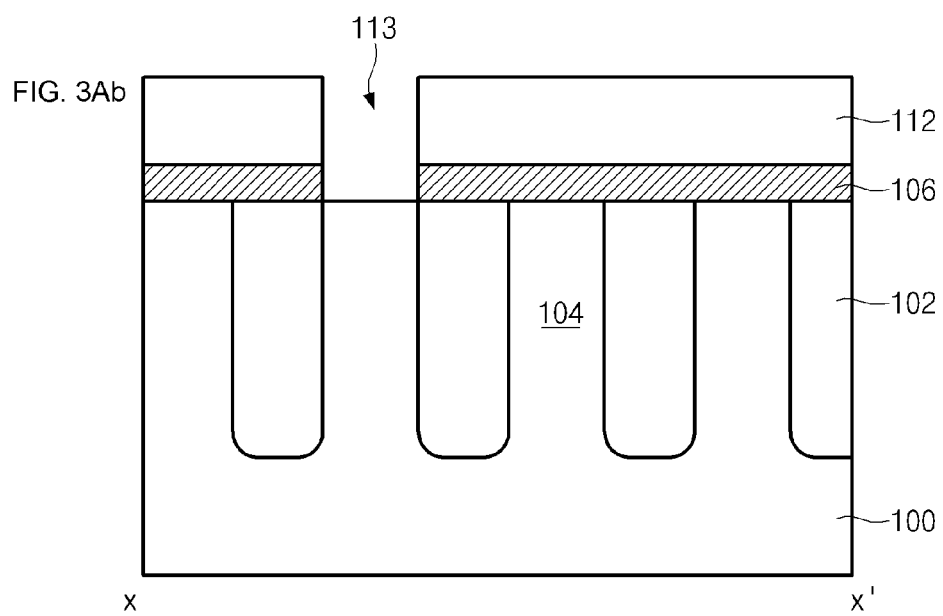

FIGS. 3Aa to 3Fb illustrate a method for forming a semiconductor device according to an embodiment of the present invention. FIGS. 3Aa to 3Fa are cross-sectional views taken along the line y-y' of FIGS. 1 and 3Ab to 3Fb are cross-sectional views taken along the line x-x' of FIG. 1.

Referring to FIGS. 3Aa and 3Ab, a hard mask pattern 106 is formed over the semiconductor substrate 100 including the active region 104 defined by the device isolation film 102. The device isolation film 102 and the active region 104 are etched using the hard mask pattern 106 as a mask, and a trench is formed. Subsequently, a conductive layer is formed in the trench, and an etchback process is performed so that a gate electrode layer 108 fills a lower portion of the trench. Then, a capping insulation film 110 is formed over the gate electrode layer 108, and the interlayer insulation film 112 is formed over the capping insulation film 110 and the hard mask pattern 106. The interlayer insulation film 112 is etched to expose the active region 104 so that a bit line contact hole 113 is formed.

Figure 3B:
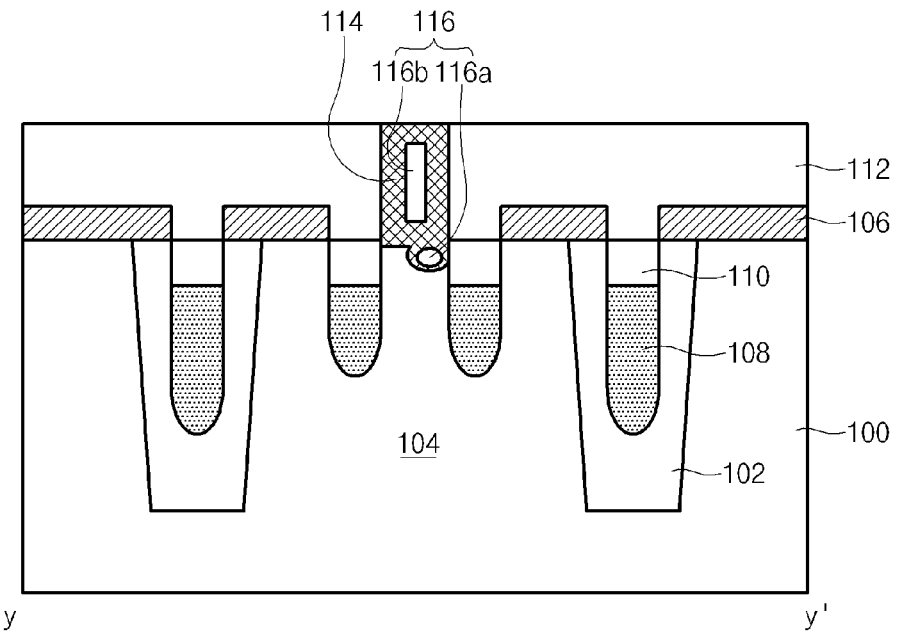
Figure 3B:
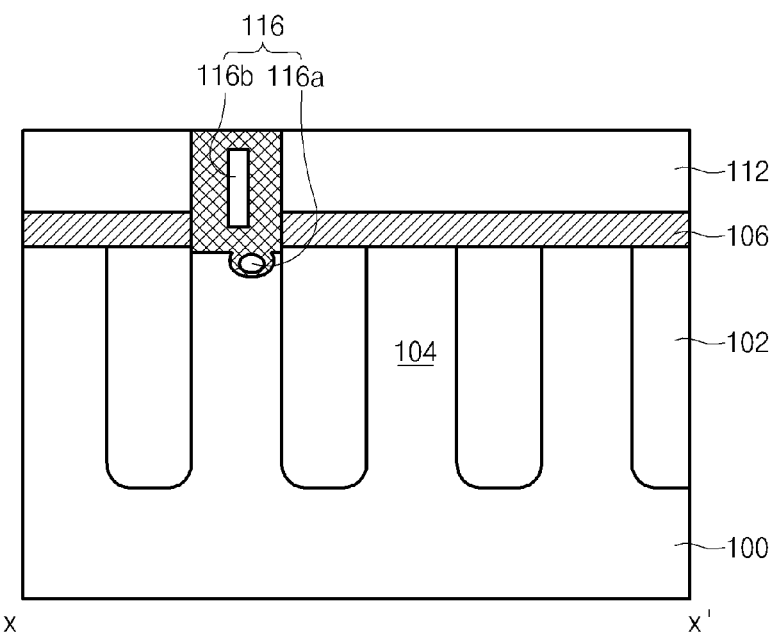

Referring to FIGS. 3Ba and 3Bb, a conductive layer fills the bit line contact hole 113 so as to form a bit line contact plug 114. Preferably, the conductive layer filling in the bit line contact hole 113 may include polysilicon. The polysilicon layer may be formed to a depth of 100 Å~1000 Å at a temperature of 500° C.~600° C. When the polysilicon layer is formed to a depth of 400 Å~1000 Å, it is preferable that an etchback process be performed on the polysilicon layer.

The bit line contact hole 113 has a very narrow width because it is highly integrated, so that the polysilicon fills in the bit line contact hole 113 incompletely, thereby forming a void 116. The void 116 may include a slit-shaped void 116b and a circular-shaped void 116a formed in an active region by a subsequent thermal process.

Figure 3C:
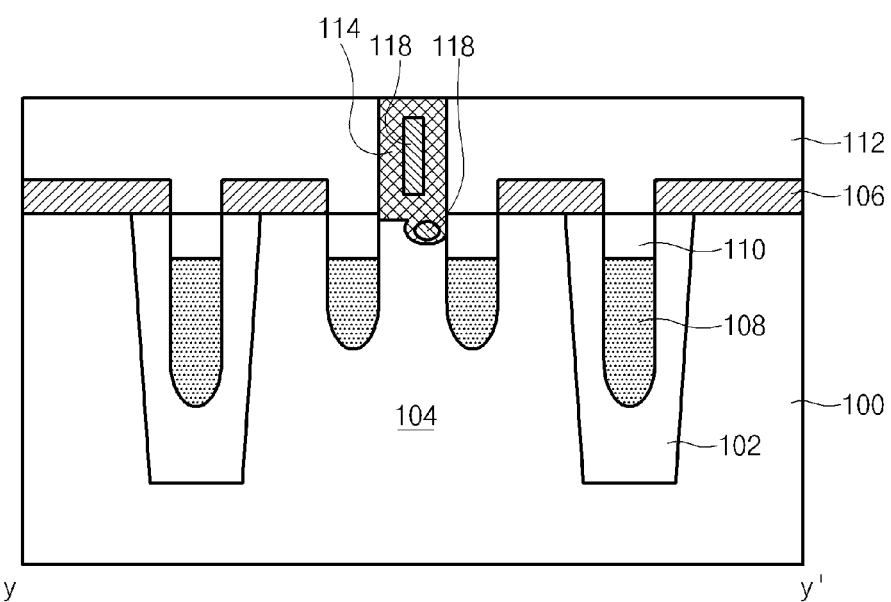
Figure 3C:
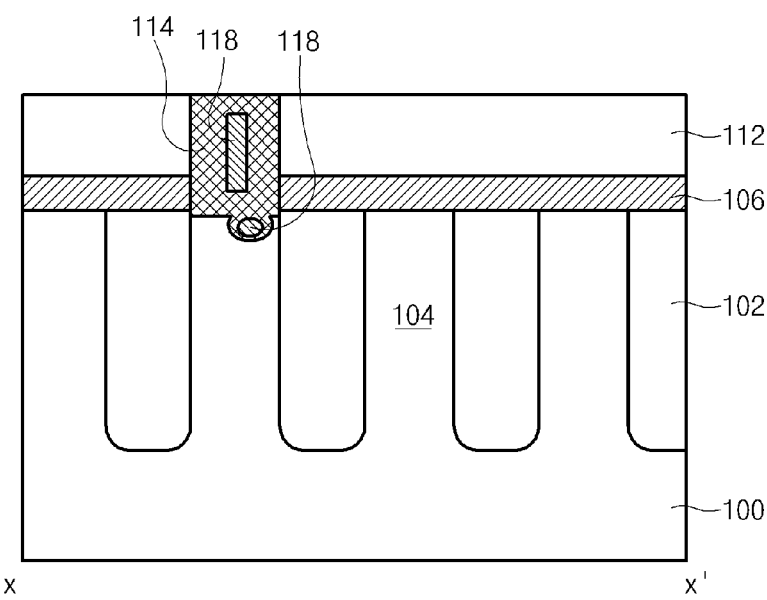

Referring to FIGS. 3Ca and 3Cb, an ion implantation region 118 is formed by implanting ions into the void 116. Preferably, ions implanted may include silicon ions (Si+) and phosphorus ions (P+). Although the ion implantation region 118 may be formed by sequentially implanting silicon ions (Si+) and phosphorous ions (P+) according to the embodiment of the present invention, the scope and spirit of the present invention is not limited thereto. For example, silicon ions (Si+) and phosphorous ions (P+) may be mixed and then implanted. In an embodiment, the ions implanted include silicon ions and dopant ions other than phosphorus ions. In an embodiment, the implanted ions completely fill the void.

In an embodiment, energy for silicon ion (Si+) implantation may be 1 KeV~200 KeV, a dose may be 1E13 to 1E17, a tilt angle may be 0° to 45°, and a rotation angle may be 0° to 360°. Preferably, energy for phosphorous ion (P+) implantation may be 1 KeV to 100 KeV, a dose may be 1E13 to 1E17, a tilt angle may be 0° to 45°, and a rotation angle may be 0° to 360°. The tilt angle may indicate an angle of the semiconductor substrate with respect to ground surface, and the rotation angle may indicate a rotation angle of an ion implantation device with respect to the surface of the semiconductor substrate.

Figure 3D:
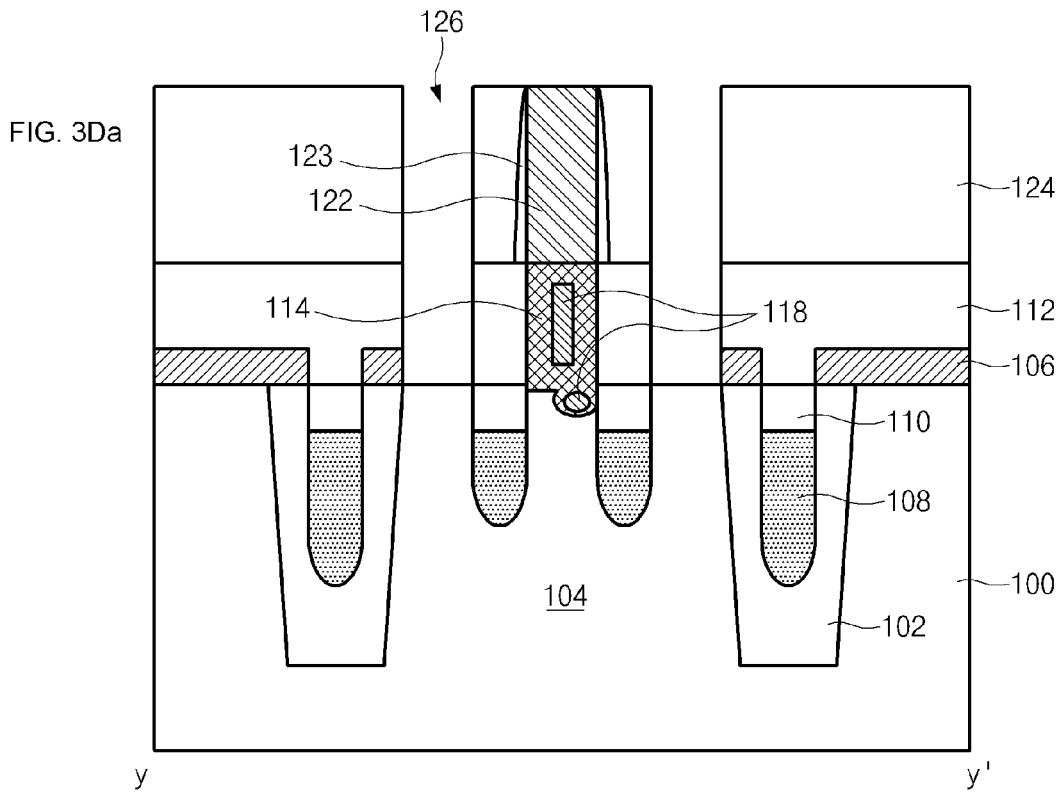
Figure 3D:
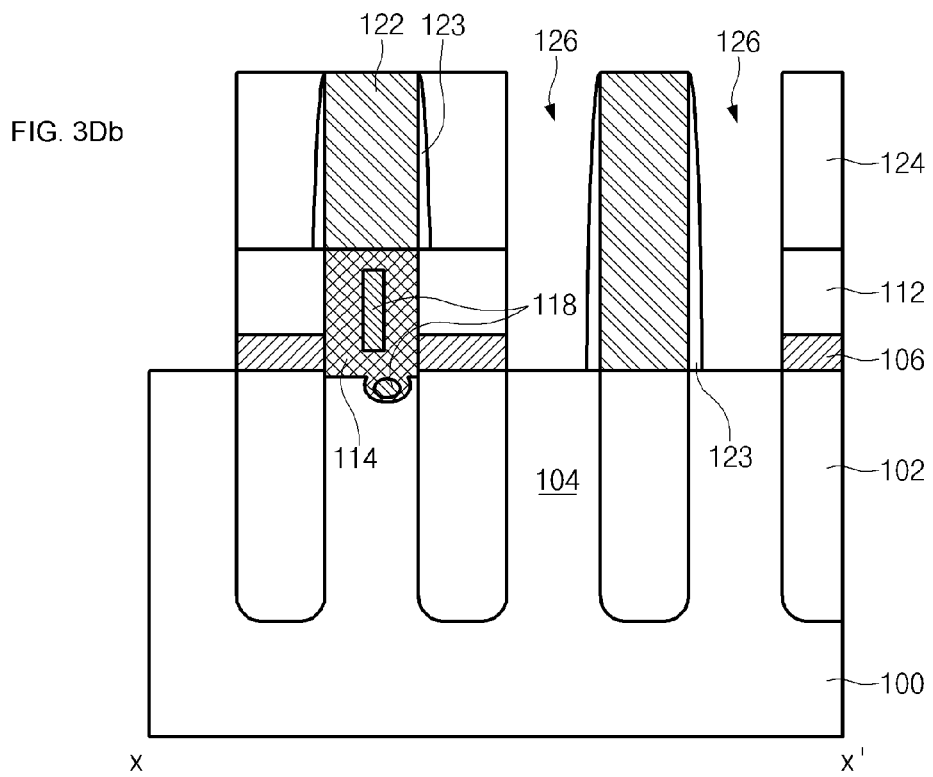

Referring to FIGS. 3Da and 3Db, a bit line 122, which is coupled to a bit line contact plug 114 including an ion implantation region 118, is formed. The bit line 122 may have a laminated structure of a titanium (Ti) film, a titanium nitride (TiN) film, and a tungsten (W) layer. Although not shown in FIGS. 3Da and 3Db, it is preferable that a hard mask layer formed of a nitride material be formed over the bit line 122. In this case, the bit line 122 is formed in a line type in such a manner that it is coupled to the bit line contact plug 114, and may also be formed over the device isolation film 102 as shown in FIG. 3Db.

After a spacer insulation film is formed over the semiconductor substrate 100 including the bit line contact plug 114 and the bit line 122, the spacer insulation film is etched back to form bit line spacer 123.

After that, the interlayer insulation film 124 is formed over the interlayer insulation film 112 including the bit line 122. The interlayer insulation films 124 and 112 are etched to expose the active region 104 using a photoresist pattern (not shown) defining a storage node contact hole that is formed over the interlayer insulation film 124 as a mask, so that a storage node contact hole 126 is formed.

Figure 3E:
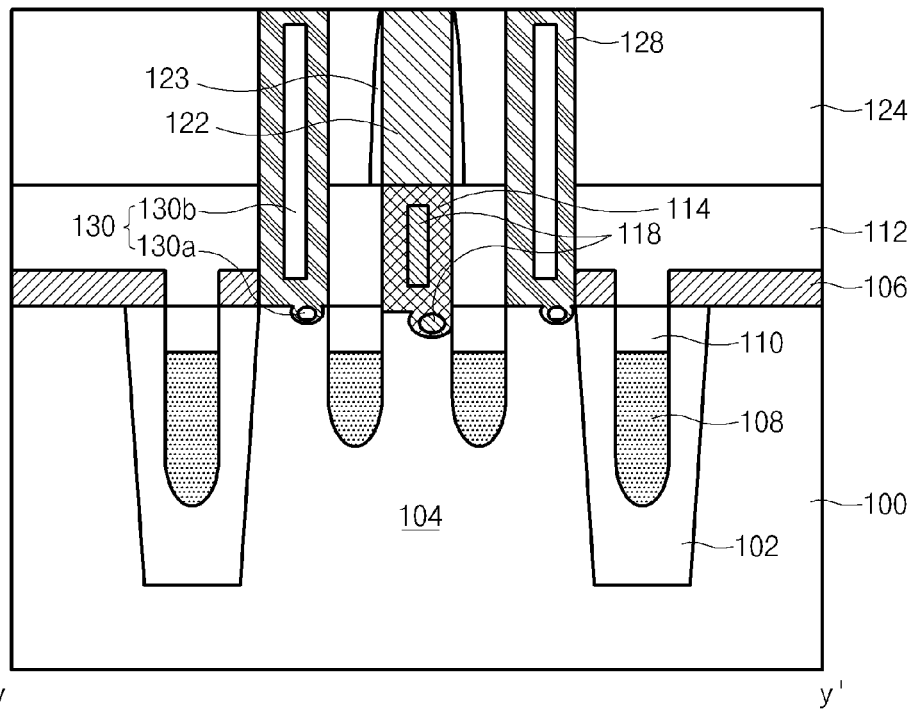
Figure 3E:
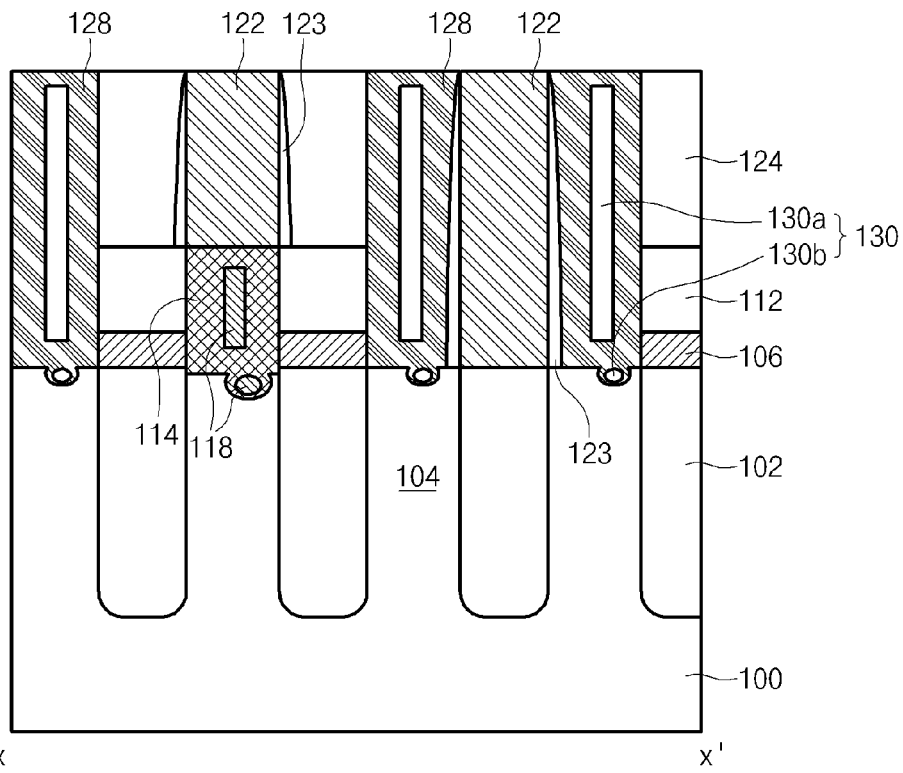

Referring to FIGS. 3Ea and 3Eb, a conductive layer fills in the storage node contact hole 126 so as to form a storage node contact plug 128. The conductive layer filling in the storage node contact hole 126 may include polysilicon. The polysilicon layer may be formed to a depth of 100 Å~1000 Å at a temperature of 500° C.~600° C. When the polysilicon layer is formed to a depth of 400 Å~1000 Å, it is preferable that a planarization etch process be performed on the polysilicon layer.

The storage node contact hole 126 has a very narrow width because it is highly integrated, so that the polysilicon fills in the storage node contact hole 126 incompletely, thereby forming a void 130. In this case, the void 130 may include a slit-shaped void 130b or a circular-shaped void 130a formed in an active region by a subsequent thermal process.

Figure 3F:
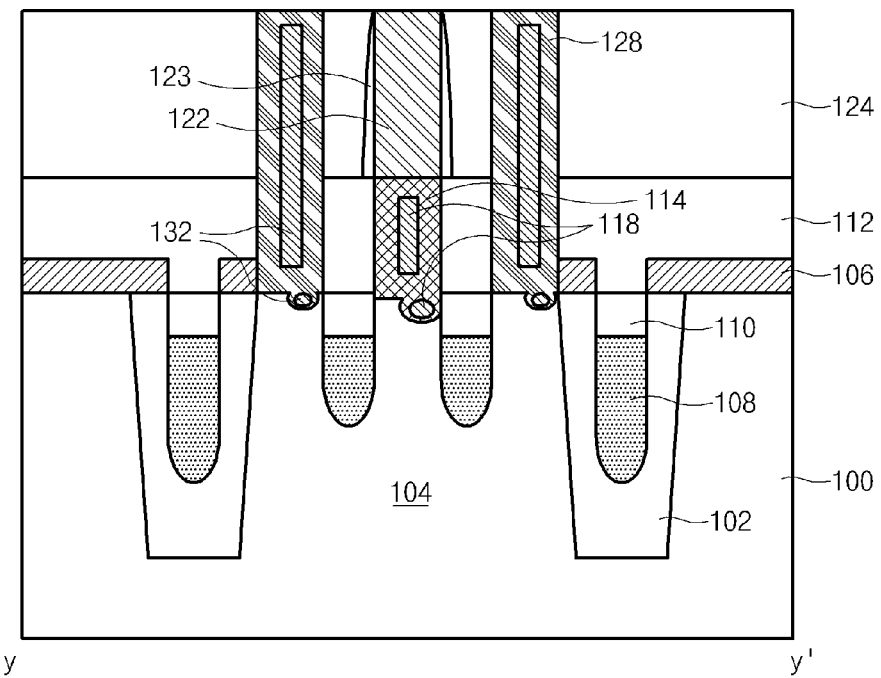
Figure 3F:
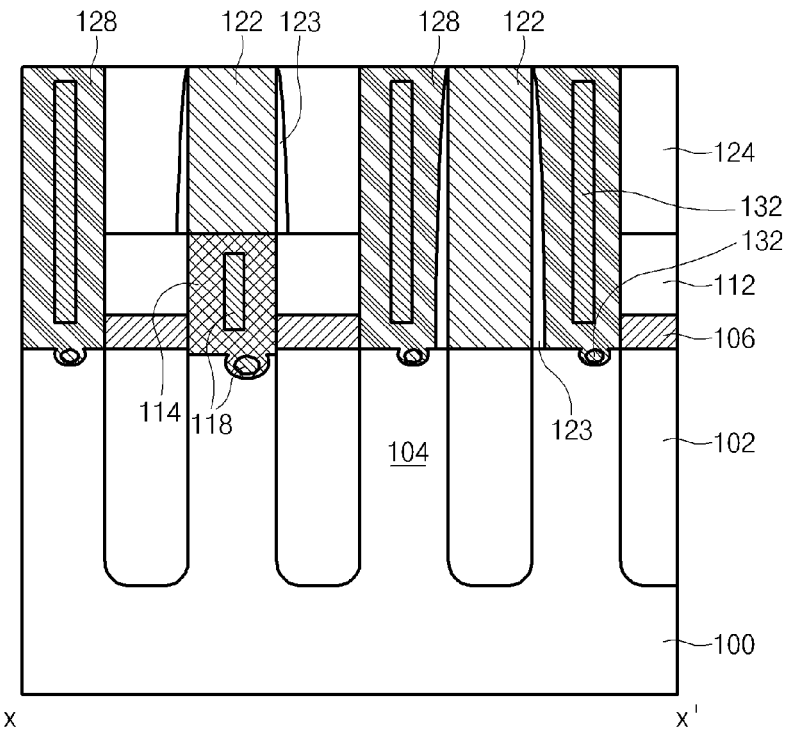

Referring to FIGS. 3Fa and 3Fb, an ion implantation region 132 is formed by implanting ions into the void 130. Preferably, ions implanted to form the ion implantation region 132 may include silicon ions (Si+) and phosphorus ions (P+). In an embodiment, the ions implanted include silicon ions and dopant ions other than phosphorus ions. Although the ion implantation region 132 may be formed by sequentially implanting silicon ions (Si+) or phosphorous ions (P+) according to an embodiment of the present invention, the scope and spirit of the present invention is not limited thereto. For example, silicon ions (Si+) and phosphorous ions (P+) may be mixed and implanted.

In this case, energy for silicon ion (Si+) implantation may be 1 KeV200 KeV, a dose may be 1E13 to 1E17, a tilt angle may be 0° to 45°, and a rotation angle may be 0° to 360°. Preferably, energy for phosphorous ion (P+) implantation may be 1 KeV to 100 KeV, a dose may be 1E 13 to 1E17, a tilt angle may be 0° to 45°, and a rotation angle may be 0° to 360°.

As is apparent from the above description, according to the embodiments of the present invention, when forming a bit line contact plug or a storage node contact plug, if a void is formed in the contact plug because the semiconductor device is highly integrated, ions are implanted into the void so that the void is filled and an ion implantation region is formed. As a result, increase in contact plug resistance is prevented, and deterioration of semiconductor device characteristics is prevented.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A method for forming a semiconductor device comprising:
   providing a semiconductor substrate including an active region defined by a device isolation film;
   forming a contact plug that is coupled to the active region, the contact plug including a void therein, the void being completely enclosed by the contact plug; and
   providing ions into the contact plug to fill the void with the ions through the contact plug while the void remains completely enclosed by the contact plug to thereby form an ion implantation region, the ions including silicon material and dopants,
   wherein the ions are provided within the void using an ion implantation step without using an anneal process.

2. The method according to claim 1, wherein the ion implantation step includes:
   implanting silicon (Si+) ions and phosphorous (P+) ions through the contact plug and into the void.

3. The method according to claim 1, wherein the forming of the contact plug includes:
   forming a bit line contact plug; and
   forming a storage node contact plug.

4. The method according to claim 2, the method further comprising:
   forming a gate electrode layer buried in the device isolation film and the active region.

5. The method according to claim 3, wherein the forming of the bit line contact plug includes:
   forming a first interlayer insulation film over the semiconductor substrate;
   forming a bit line contact hole by etching the first interlayer insulation film to expose the active region; and
   forming a first conductive layer in the bit line contact hole.

6. The method according to claim 5, wherein forming the conductive layer in the bit line contact hole includes:
   forming a first void in the first conductive layer.

7. The method according to claim 3, the method further comprising:
   forming a bit line over the bit line contact plug in such a manner that the bit line is coupled to the bit line contact plug.

8. The method according to claim 5, wherein the forming of the storage node contact plug includes:
   forming a second interlayer insulation film over a first interlayer insulation film;
   forming a storage node contact hole by etching a second interlayer insulation film and the first interlayer insulation film to expose the active region; and
   forming a second conductive layer in the storage node contact hole.

9. The method according to claim 8, wherein forming the second conductive layer in the storage node contact hole includes:

forming a second void in the second conductive layer.

* * * * *